United States Patent
Ren et al.

(10) Patent No.: US 11,841,384 B2
(45) Date of Patent: Dec. 12, 2023

(54) INRUSH CURRENT DETECTION METHOD, DEVICE AND COMPUTER-READABLE STORAGE MEDIUM FOR TRANSFORMER

(71) Applicant: Schneider Electric Industries SAS, Rueil-Malmaison (FR)

(72) Inventors: Rui Ren, Shanghai (CN); Yu Cao, Shanghai (CN); Rong Li, Shanghai (CN)

(73) Assignee: Schneider Electric Industries SAS, Rueil-Malmaison (FR)

( * ) Notice: Subject to any disclaimer, the term of this patent is extended or adjusted under 35 U.S.C. 154(b) by 5 days.

(21) Appl. No.: 17/397,331

(22) Filed: Aug. 9, 2021

(65) Prior Publication Data
US 2022/0043035 A1 Feb. 10, 2022

(30) Foreign Application Priority Data
Aug. 10, 2020 (CN) .......................... 202010794821.2

(51) Int. Cl.
H02J 13/00 (2006.01)
G01R 19/00 (2006.01)
G06N 3/04 (2023.01)
H01H 47/00 (2006.01)

(52) U.S. Cl.
CPC .......... *G01R 19/0092* (2013.01); *G06N 3/04* (2013.01); *H02J 13/0004* (2020.01); *H01H 47/002* (2013.01); *H02J 13/00034* (2020.01)

(58) Field of Classification Search
CPC ............. G01R 19/0092; G01R 19/00; G01R 19/16547; G01R 19/165; G01R 31/00; G06N 3/04; G06N 3/0454; G06N 3/063; G06N 3/084; G06N 3/08; H02J 13/0004; H02J 13/00; H02J 13/00034; H01H 47/002; H01H 47/00; H02H 1/00; H02H 1/0092;
(Continued)

(56) References Cited

FOREIGN PATENT DOCUMENTS

| CN | 102510044 A | * | 6/2012 | |
| CN | 102510044 A | | 6/2012 | |
| CN | 108279364 A | * | 7/2018 | .......... G01R 31/088 |

(Continued)

OTHER PUBLICATIONS

Training an Artificial Neural Network to Discriminate between Magnetizing Inrush and Internal Faults, IEEE Transactions on Power Delivery, vol. 9, No. 1, New York, US, Jan. 1994, pp. 434-441 (Year: 1994).*

(Continued)

*Primary Examiner* — Tarun Sinha
*Assistant Examiner* — James I Burris
(74) *Attorney, Agent, or Firm* — Locke Lord LLP

(57) ABSTRACT

An inrush current detection method, an inrush current detection device and a computer-readable storage medium for a transformer are disclosed. The inrush current detection method includes sampling at least a part of a current signal of the transformer to obtain a numerical matrix; providing the numerical matrix as an input to an inrush current detection neural network; and calculating and outputting a label vector corresponding to the numerical matrix by the inrush current detection neural network, wherein the label vector indicates whether the current signal is an inrush current.

12 Claims, 8 Drawing Sheets

(58) Field of Classification Search
CPC ........ H02H 1/043; H02H 1/04; G06K 9/6256; G06K 9/62
See application file for complete search history.

(56) References Cited

FOREIGN PATENT DOCUMENTS

| | | | | |
|---|---|---|---|---|
| DE | 19954950 | A1 | 5/2001 | |
| EP | 1890165 | A2 * | 2/2008 | ........... G01R 31/025 |
| EP | 3460494 | A1 * | 3/2019 | |
| WO | WO-2015118163 | A1 * | 8/2015 | ........... G01R 31/086 |

OTHER PUBLICATIONS

Perez, Luis G. et al., "Training an Artificial Neural Network To Discriminate Between Magnetizing Inrush and Internal Faults", IEEE Transactions on Power Delivery, vol. 9, No. 1, Jan. 1994, pp. 434-441.
Extended European Search Report dated Jan. 10, 2022 for corresponding European Patent Application No. 21306108.8-1010, 12 pages.

* cited by examiner

V=[0.0052,0.9948]

V=[0.9964,0.0036]

INRUSH CURRENT DETECTION METHOD, DEVICE AND COMPUTER-READABLE STORAGE MEDIUM FOR TRANSFORMER

TECHNICAL FIELD

The present disclosure relates to an inrush current detection method and a device for a transformer, and more specifically, to an inrush current detection method, an inrush current detection device, and a computer-readable storage medium for a transformer.

BACKGROUND

A large current that occurs during a power-on period of a transformer is called an inrush current. The inrush current is a current generated when a voltage at a side connected to a power supply establishes a magnetic field in a transformer core, but it is not generated at the side not connected to the power supply. A maximum peak value of the inrush current may reach 6~8 times of its rated current, and its duration can be as long as 10 seconds. Relay protection must avoid action at this time, otherwise, the transformer may not be able to be powered on successfully, that is, the transformer may not able to convert from a voltage-free state where the power supply is disconnected to a voltage state where the power supply is connected. This behavior of avoiding the action of relay protection is called "latch-up protection". At present, the commonly used latch-up protection algorithm uses a phenomenon that inrush current contains rich second harmonic content to identify the appearance and disappearance of the inrush current. When the second harmonic is higher than a threshold value, for example, when a ratio of an amplitude of the second harmonic to an amplitude of a fundamental wave is greater than or equal to 25%, the current signal is judged as inrush current, and "latch-up protection" should be adopted. However, the second harmonic method is slow and not accurate enough.

SUMMARY OF THE INVENTION

The disclosure relates to a method capable of rapidly and accurately detecting an inrush current of a transformer.

According to an aspect of the present disclosure, an inrush current detection method for a transformer is provided. The method comprises sampling at least a part of a current signal of the transformer to obtain a numerical matrix; providing the numerical matrix as an input to an inrush current detection neural network; and calculating and outputting a label vector corresponding to the numerical matrix by the inrush current detection neural network, wherein the label vector indicates whether the current signal is an inrush current.

Optionally, the method further comprises detecting whether a maximum value in the numerical matrix is greater than or equal to a preset enabling threshold; and only when the maximum value in the numerical matrix is greater than or equal to the preset enabling threshold, the numerical matrix is provided as an input to the inrush current detection neural network.

Optionally, the at least a part of the current signal is a part corresponding to a half cycle of the current signal.

Optionally, the current signal is a three-phases current signal, and one row or one column of the numerical matrix corresponds to one phase in the three-phase current signal.

Optionally, the inrush current detection neural network is a convolution neural network.

Optionally, the inrush current detection neural network is a trained neural network, and the training includes the following steps: step 1, acquiring a current signal training sample set for training the inrush current detection neural network; step 2, providing a training sample in the current signal training sample set as an input to the inrush current detection neural network; step 3, calculating a label vector corresponding to the training sample by the inrush current detection neural network; step 4, determining a processing loss of the inrush current detection neural network based on the label vector of the training sample; and step 5: if the processing loss is greater than or equal to a preset processing loss threshold, update a parameter of the inrush current detection neural network and perform steps 2 to 5 based on the updated inrush current detection neural network, and if the processing loss is less than or equal to the preset processing loss threshold, stop the training.

Optionally, the inrush current detection neural network includes at least a first convolution layer, a second convolution layer, a fully connected layer, an activation layer and an output layer; and the parameter of the inrush current detection neural network includes at least a weight matrix of a first convolution kernel included in the first convolution layer, a weight matrix of a second convolution kernel included in the second convolution layer, and a weight matrix of the fully connected layer.

Optionally, the inrush current detection neural network further includes a first pooling layer between the first convolution layer and the second convolution layer, and a second pooling layer between the second convolution layer and the fully connected layer, and the first pooling layer and/or the second pooling layer are downsampled by a maximum pooling method.

Optionally, the first convolution layer adopts a first convolution kernel with a size of 3×3; the second convolution layer adopts a second convolution kernel with a size of 3×3; and the activation function is one of sigmoid function, relu function and tanh function.

Optionally, one or more samples in the current signal training sample set are generated by an Electro-Magnetic Transient Program EMTP.

According to another aspect of the present disclosure, an inrush current detection device for a transformer is provided. The device comprises a sampling module, configured to sample at least a part of a current signal of the transformer to obtain a numerical matrix; an input module, configured to provide the numerical matrix as an input to an inrush current detection neural network; and a classification module, configured with the inrush current detection neural network, wherein the inrush current detection neural network calculates and outputs a label vector corresponding to the numerical matrix, and the label vector indicates whether the current signal is an inrush current.

Optionally, the input module is further configured to detect whether a maximum value in the numerical matrix is greater than or equal to a preset enabling threshold, and only when the maximum value in the numerical matrix is greater than or equal to the preset enabling threshold, provide the numerical matrix as an input to the inrush current detection neural network.

According to another aspect of the present disclosure, an inrush current detection device for a transformer is provided. The device comprises a processor; and a memory, wherein a computer-executable program is stored in the memory, and when the program is executed by the processor, the device is caused to execute the method any one of the above.

According to another aspect of the present disclosure, there is provided a computer-readable storage medium having stored thereon computer instructions which, when executed by a processor, implement the method of any one of the above.

According to the above aspects of the disclosure, using a neural network to detect the inrush current of transformer requires few sampling points, has fast detection speed and high accuracy, and can perform detection under the condition that inrush current and fault current coexist.

BRIEF DESCRIPTION OF THE DRAWINGS

These and/or other aspects, features and advantages of the present disclosure will become clearer and easier to understand from the following description of the present disclosure taken in conjunction with the accompanying drawings, in which.

DESCRIPTION OF THE EMBODIMENTS

Figure 1:
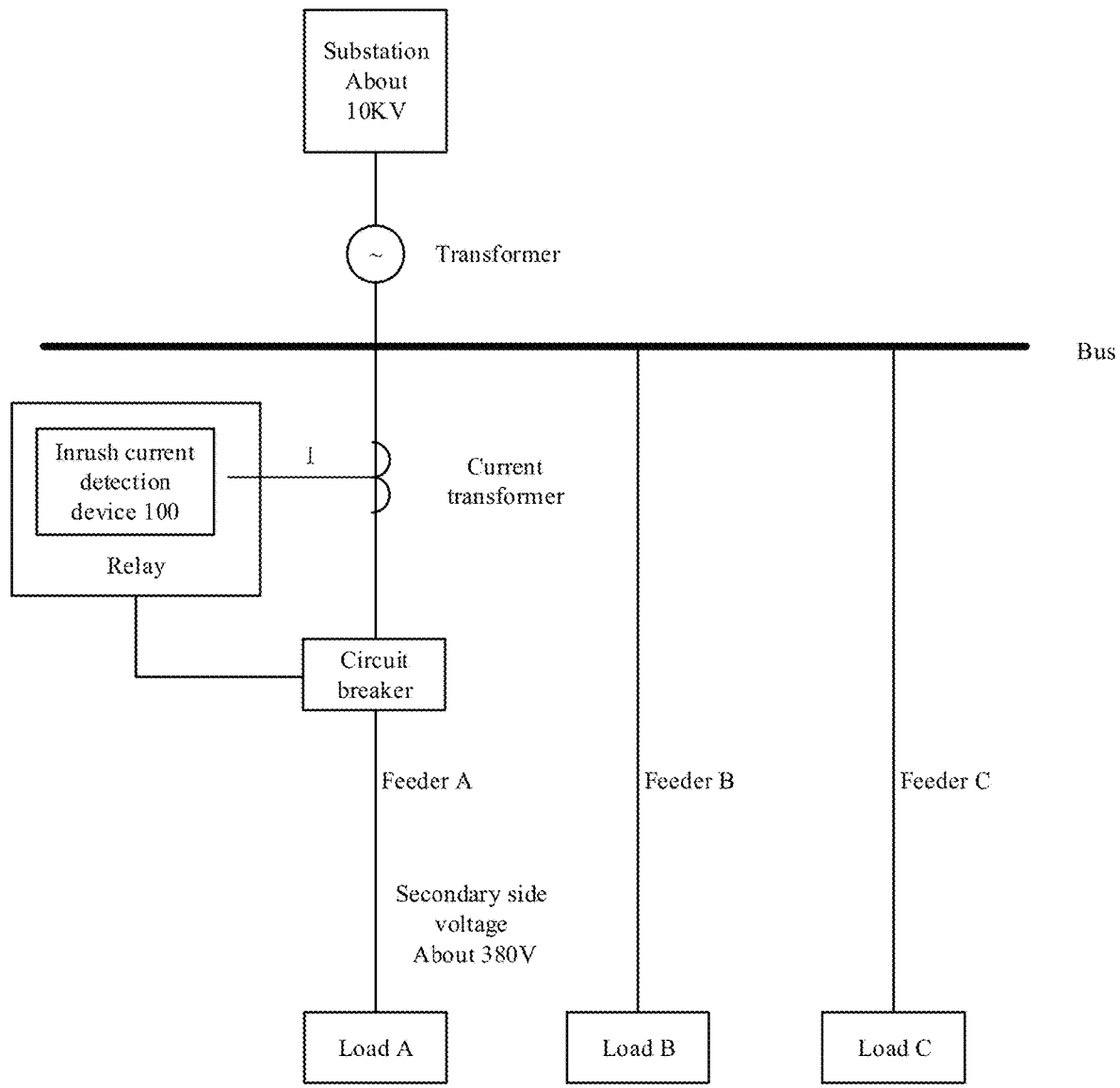
FIG. 1 is a usage scenario diagram illustrating an inrush current detection device according to an embodiment of the present disclosure.

Hereinafter, the present disclosure will be described in detail with reference to exemplary embodiments thereof. However, the present disclosure is not limited to the embodiments described herein, but may be implemented in many different forms. The described embodiments are only used to make this disclosure thorough and complete, and to fully convey the concepts of this disclosure to those skilled in the art. The features of the various embodiments described may be combined or replaced with each other unless explicitly excluded or should be excluded according to the context.

At present, the method of the inrush current detection is mainly the second harmonic method. Its principle is to identify the appearance and disappearance of the inrush current by using the phenomenon that inrush current contains rich second harmonic content. When the second harmonic is higher than a threshold value, for example, when the ratio of the amplitude of second harmonic to the amplitude of a fundamental wave is greater than or equal to 25%, the current signal is judged as an inrush current. However, the second harmonic method has an obvious disadvantage of slow detection speed. For example, taking a transformer with a power frequency of 50 Hz as an example, the cycle of its current signal is 20 ms. In this case, the detection of the second harmonic brings a time delay of at least 20 ms to the latch-up protection action, because for any sudden change in current, the discrete Fourier transform (DFT) will generate higher harmonics including the second harmonic within at least one cycle, and these higher harmonics will disappear within 20-30 ms. Therefore, for some scenarios, it cannot meet the needs of fast latch-up protection. Once the latch-up protection mechanism based on the second harmonic method is adopted, the latch-up protection action cannot be implemented until the second harmonic disappears. In addition, since almost all sudden changes in current generates the second harmonic, the second harmonic may detect non-inrush current (i.e., fault current) as inrush current, thus the second harmonic method cannot be used when inrush current and fault current coexist.

In addition to the second harmonic method, at present, one or more of the following methods are also used: the inrush current criterion based on pure magnitude of a voltage, such as voltage harmonic braking principle and voltage ratio method, or the like; inrush criterion based on a pure magnitude of a current, such as waveform symmetry principle, dead angle principle, or the like; criterion based on current and voltage, such as power differential principle, magnetic flux characteristic principle, equivalent circuit principle, or the like. However, these methods have strict usage conditions, and may be ineffective in some protection scenarios. For example, the dead angle method uses a principle that a dead angle usually occurs in an inrush current waveform while hardly occurs in a fault waveform to perform inrush current detection. However, the dead angle method needs high-resolution sampling, and a number of sampling points per power frequency cycle is at least 36. Moreover, since the current of the inrush current dead angle is very small, the absolute value of it is close to zero, and the conversion processing loss of ADC chip near the zero point is the biggest, the dead angle method further needs an ADC chip with a higher resolution. In addition, in some cases, the current waveform may be distorted due to higher harmonics, and the distorted waveform hardly produces the dead angle, which leads to the ineffectiveness of this method. For another example, the waveform symmetry method uses a fact that the fault waveform is generally symmetrical up and down about the time axis while the single-phase inrush current waveform is not generally symmetrical up and down about the time axis to perform inrush current detection. However, in the case of distortion, it is high likely that the originally symmetrical current becomes asymmetric, which leads to the ineffectiveness of this method.

Therefore, an inrush current detection method that can be used in various protection scenarios and improve the detection speed and accuracy is needed.

FIG. 1 is a usage scenario diagram illustrating an inrush current detection device 100 according to an embodiment of the present disclosure.

As shown in FIG. 1, the substation supplies power to loads A, B and C, such as business centers and office buildings, through transformer. The transformer distributes voltages to feeders A, B and C through buses to supply power to loads A, B and C via feeders A, B and C. There are relays and circuit breakers on each feeder A, B and C (for simplicity, only the relay and the circuit breaker on feeder A are shown in this figure). When the transformer enters into a working state, the voltage of a primary side and the voltage of a secondary side reach respective rated values, for example, the voltage of the primary side reaches about 10 kV and the voltage of the secondary side reaches about 380V. When the transformer has not yet entered into the working state, an inrush current may occur due to a full voltage charging for the transformer. At this time, the relay needs to take a "latch-up protection" action instead of tripping protection action to trip the circuit breaker.

The inrush current detection device 100 according to an embodiment of the present disclosure may be integrated into a relay as a part of the relay, or located outside the relay and exchange data or commands with the relay via a wired or wireless network. The inrush current detection device 100 may sample a current signal I from the transformer, judge whether the current signal I is inrush current, and generate a detection result. Based on the detection result, the relay indicates that the current signal I is the inrush current and takes the "latch-up protection" action, otherwise, it takes tripping protection action. The current signal I may be a current signal converted by a current transformer, and the function of the current transformer is to convert a current with a larger value into a current with a smaller value.

The inrush current detection device 100 may be configured with an inrush current detection neural network according to an embodiment of the present disclosure, the inrush current detection neural network may perform feature extraction processing on the current signal I and generate a detection result indicating whether the current signal I is an inrush current based on the extracted feature. The inrush current detection neural network needs to be trained according to the training method of the embodiment of the present disclosure, so as to become a neural network capable of judging whether the current signal I is the inrush current.

In addition, the inrush current detection device 100 can also output the inrush current detection result to an external display device (not shown in this figure). The external display device can communicate with the inrush current detection device via a wired or wireless network. The display device may display the detection result of the inrush current detection device 100 in various ways, such as text, image, video, or the like.

Since the detection result of the inrush current detection device 100 is generated by using a trained inrush current detection neural network, based on the obvious advantages of neural network in feature extraction and classification, it overcomes the shortcomings of conventional detection methods, such as slow detection speed and inability to distinguish inrush current from fault current for the second harmonic detection method, high sampling resolution and possibly ineffectiveness for the dead angle method, and ineffectiveness for the waveform symmetry method, and realizes more efficient inrush current detection.

Figure 2:
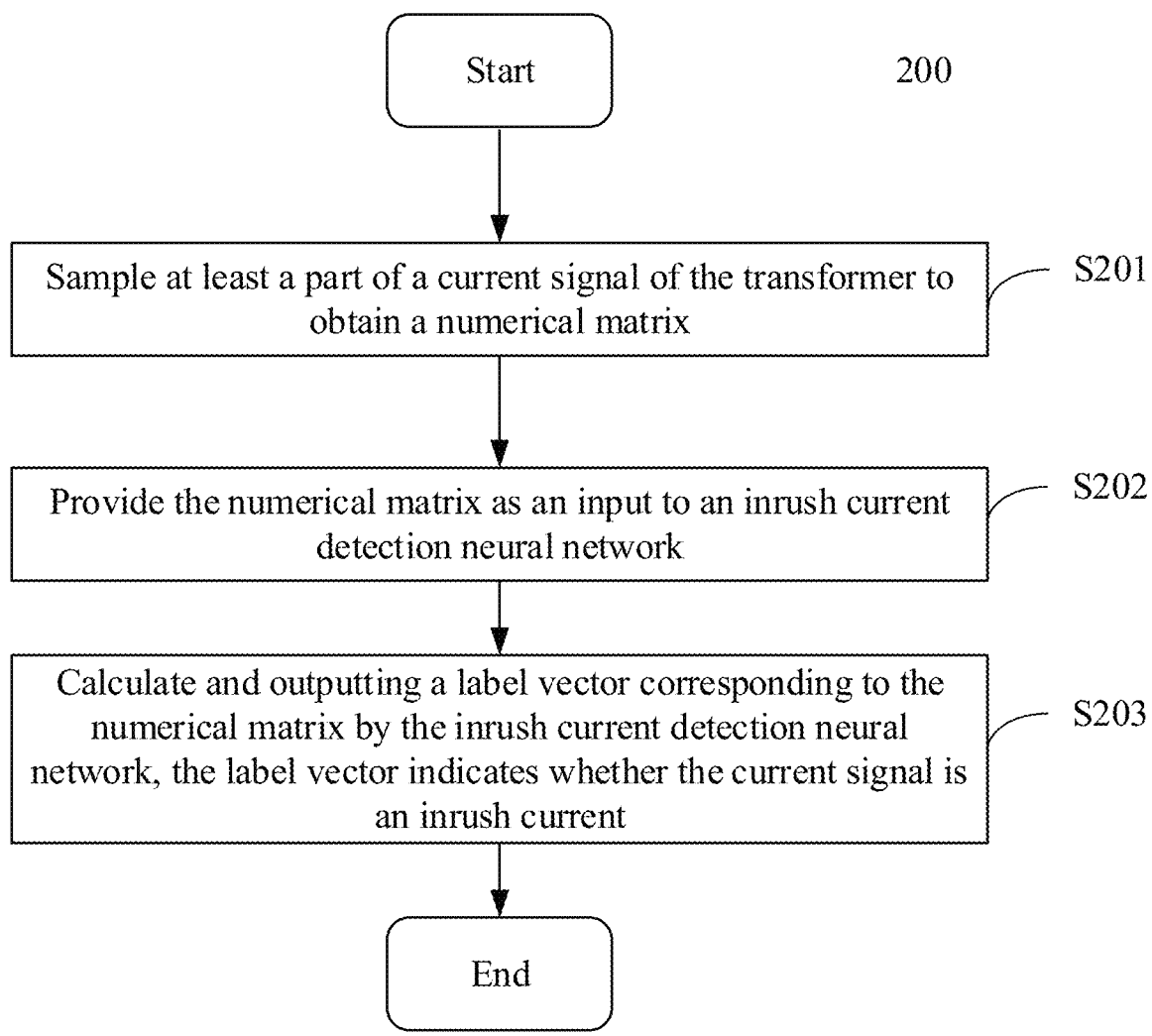
FIG. 2 is a flowchart of an inrush current detection method according to an embodiment of the present disclosure.

FIG. 2 is a flowchart of an inrush current detection method 200 according to an embodiment of the present disclosure.

The inrush current detection method 200 shown in FIG. 2 can be implemented by the inrush current detection device 100 in FIG. 1. In the inrush current detection device 100, a trained inrush current detection neural network according to an embodiment of the present disclosure is configured. As shown in FIG. 2, the inrush current detection method 200 may include steps S201-S203.

At step S201, at least a part of a current signal I of the transformer is sampled to obtain a numerical matrix M. In this step, the current signal I may be a current signal which has been output from the transformer 101 and subjected to appropriate preprocessing. The preprocessing includes, but is not limited to, converting a current signal with a larger numerical value directly output from the transformer 101 into a current signal with a smaller numerical value according to a certain ratio via a current transformer. In this step, when sampling the current signal I, the sampling resolution is k sampling points per power frequency cycle, and a value of k can be selected according to application needs. According to the embodiment of the present invention, the value of k can be small, for example, as low as 32, and a sampling range is N cycles, for example, N can be as low as ½. In this step, the numerical matrix M is an arrangement of sampling values of the current signal I, in which one row or one column corresponds to one phase of the current signal. For example, In case that the current signal I is a three-phases current, sampling N cycles within the current signal I obtains a numerical matrix M with a size of 3×Nk, and one row of the numerical matrix M corresponds to one phase of the three-phase current signal.

At step S202, the numerical matrix M is provided as an input to the inrush current detection neural network. The inrush current detection neural network is a trained inrush current detection neural network, and the training method for it will be described below with reference to FIG. 5.

In step S203, the inrush current detection neural network calculates and outputs a label vector V corresponding to the numerical matrix M, the label vector V indicates whether the current signal I is an inrush current. In this step, the inrush current detection neural network performs feature extraction process on the current signal I, and generates a detection result based on the extracted feature. In other words, the inrush current detection neural network performs a series of operations on the numerical matrix M input in step S203 to obtain a label vector V indicating whether the current signal I is an inrush current. A category corresponding to the maximum value in label vector V is a prediction result of the inrush current neural network.

In the embodiment of the disclosure, the inrush current detection neural network is used to detect whether the current signal of the transformer is the inrush current. Since the neural network has obvious advantages in feature extraction and feature-based classification, the fault current can be accurately judged as a non-inrush current signal even when the inrush current and the fault current coexist, which improves the accuracy of the inrush current detection.

In addition, in the embodiment of the present disclosure, the sampling range of the inrush current detection device 100 can be as low as N=½ cycle, that is, when the power frequency is 50 Hz, it can obtain the detection result after 10 ms of the inrush current occurs. Compared with the second harmonic method which requires at least 20~30 ms to obtain the detection result, the detection time is reduced and the detection speed is improved.

In addition, in the embodiment of the present disclosure, the sampling resolution can be as low as k=32, which reduces the requirement for sampling resolution compared with the existing detection method, such as the dead angle method which has a sampling resolution of at least 36.

Figure 3:
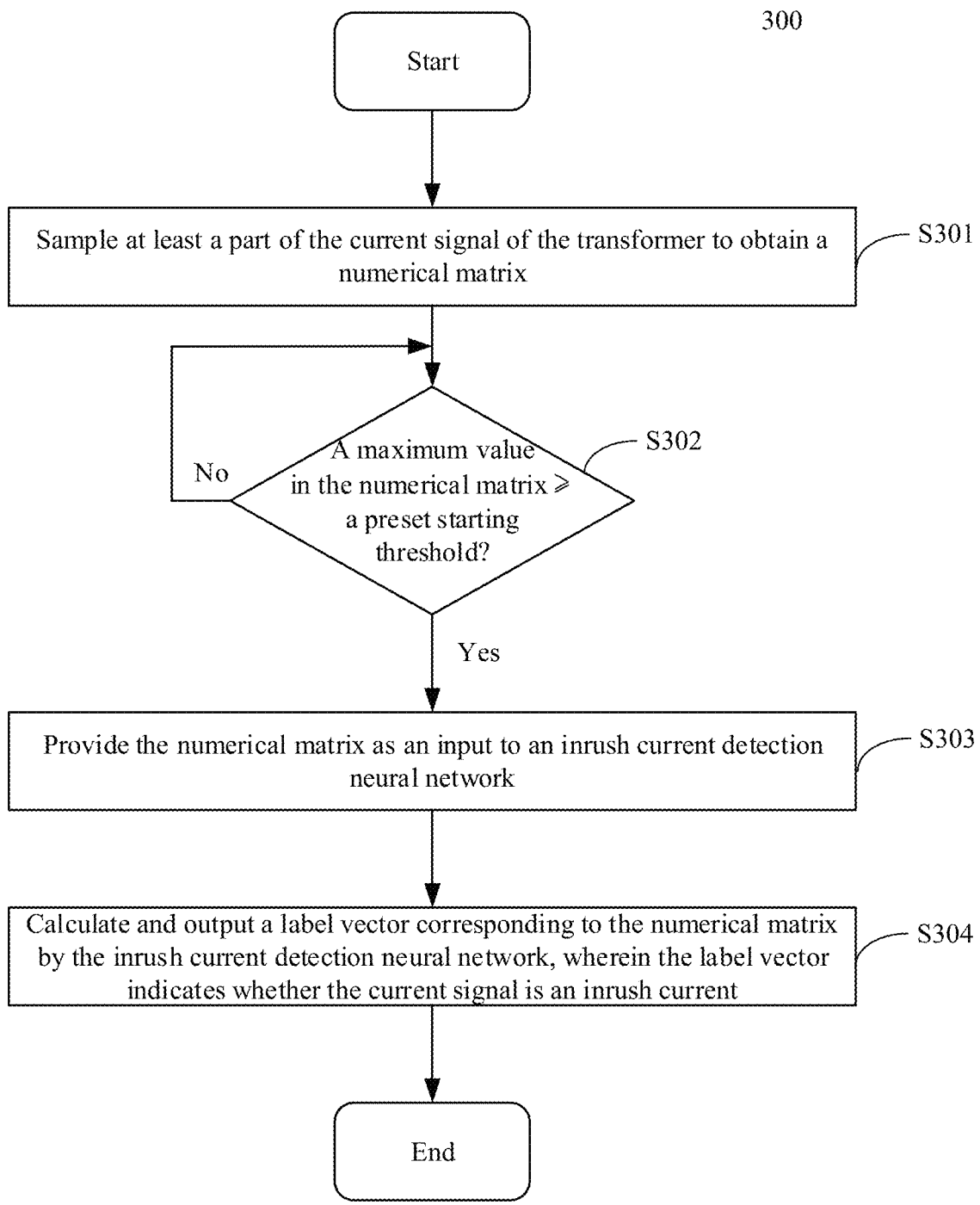
FIG. 3 is a flowchart of an inrush current detection method according to another embodiment of the present disclosure.

FIG. 3 is a flowchart of an inrush current detection method 300 according to another embodiment of the present disclosure.

Various reasons make the current of the transformer suddenly increases. For example, during a power-on period of the transformer, such as when the voltage of the transformer is restored after no-load input or external fault removal, the inrush current occurs because its flux linkage cannot be suddenly changed; or when an external or internal fault occurs during the operation of the transformer, the current suddenly increases due to short circuit, and the sudden change in current belongs to the fault current. However, most of the time, the current of the transformer is in a normal range. In order to save computing resources and reduce power consumption, an enabling threshold may be set for enabling the inrush current judgement.

As shown in FIG. 3, the inrush current detection method 300 may include steps S301-S304. Step S301 in method 300 is the same as step S201 in FIG. 2, except that an enabling threshold judgement operation at step 302 is added.

At step S302, it is judged whether a maximum value in the numerical matrix M obtained at step S301 is greater than a preset enabling threshold, and the maximum value corresponds to the maximum current value in the sampled current signal. The preset enabling threshold $T_{enable}$ is the threshold value for enabling the inrush neural network for feature extraction and classification, the $T_{enable}$ may be set according to actual needs, for example, it may be set as multiple of rated current, such as 5 times, 6 times, etc. And the preset enabling threshold $T_{enable}$ may be changed manually, for example, the user can adjust it according to a power environment of the transformer during the use of the transformer.

If the judgement result in step S302 is that the maximum value in the numerical matrix M is greater than or equal to the preset enabling threshold $T_{enable}$, method 300 proceeds to step S303. Similar to step S202 of method 200, in step S303, the numerical matrix M is provided as an input to the inrush current detection neural network. Similar to step S203 of method 200, in step S304, the label vector corresponding to the numerical matrix M is calculated and output by the inrush current detection neural network, and the label vector indicates whether the current signal is the inrush current. If the judgement result in step S302 is that the maximum value in the numerical matrix M is smaller than the preset enabling threshold $T_{enable}$, wait for the next numerical matrix M obtained in step S301. It should be understood that step S301 in FIG. 3 can be continuously performed, that is, the current signal I of the transformer may be continuously sampled (for example, the sampling range for each sample is a half cycle of the current signal I), thus steps S302 to S304 are repeated for each numerical matrix acquired in step S301.

In the embodiment of the present disclosure, the inrush current detection neural network is enabled only after the preset enabling threshold is met, thus saving computing resources.

Figure 4:
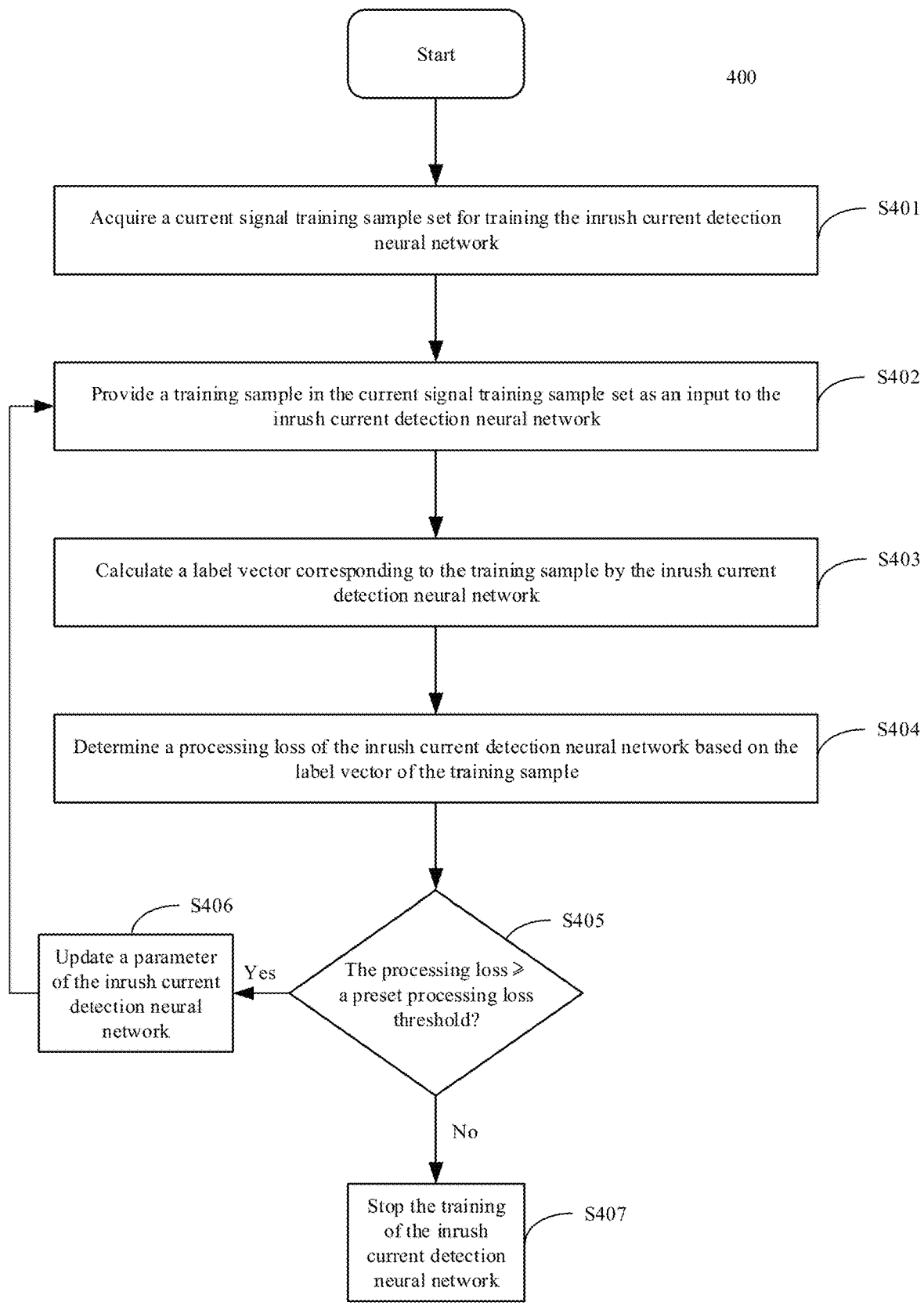
FIG. 4 is a flowchart of a training method of an inrush current detection neural network according to an embodiment of the present disclosure.

FIG. 4 is a flowchart of a training method 400 of an inrush current detection neural network according to an embodiment of the present disclosure.

As shown in FIG. 4, the training method 400 of the inrush current detection neural network includes steps S401-S407.

At step S401, a current signal training sample set for training the inrush current detection neural network is acquired. In an embodiment of the present disclosure, each sample in the current signal training sample set may be a current signal collected during actual usage of the transformer or a current signal generated by an Electro-Magnetic Transient Program EMTP or other software programs according to a specific algorithm, and these current signals may include, for example, signals that have been determined to be an inrush current, a fault current, a normal current, and the like. For example, when the current signal collected during the actual usage of the transformer is used as a sample, a sample size required for training the inrush current detection neural network cannot be obtained, then the training sample generated by EMTP may be used as a supplement. For each sample in the current signal training sample set, no matter which one of the above two cases the sample comes from, a real label vector of the sample is known, and the detection result of the inrush current detection neural network, that is, the label vector output by inrush current neural network, should be consistent with the real label vector of the sample. Therefore, the goal of training the inrush current detection neural network is to minimize the difference between the label vector calculated by the inrush current detection neural network and its real label vector for each sample in the current signal training sample set.

At step S402, a training sample in the current signal training sample set is provided as an input to the inrush current detection neural network. In this step, the training sample input may be all samples, some samples or one sample of the training sample set, which may be selected according to the sample size of the sample set, the size of computing resources, the requirements of network prediction accuracy, and so on.

At step S403, the label vector corresponding to the training sample is calculated by the inrush current detection neural network. As mentioned above, the inrush current detection neural network performs the feature extraction of the training sample input in step S402, and classifies them according to the extracted feature to obtain the label vector V indicating whether a current signal corresponding to the training sample is the inrush current.

At step S404, a processing loss of the inrush current detection neural network is determined based on the label vector of the training sample. For the training sample input in step S402, the label vector output by the inrush current detection neural network may be compared with its known real label vector. For example, for a training sample known to be an inrush current, its real label vector is [1,0], which indicating that the probability of the training sample being an inrush current is 1, and the probability of being a non-inrush current is 0. For a training sample known as a non-inrush current, its real label vector is [0,1], indicating that the probability of the training sample being inrush current is 0, and the probability of being a non-inrush current is 1. When the training of the inrush current detection neural network has not been completed, the output label vector of the training sample may be quite different from the real label vector of the training sample. For a training sample known as an inrush current, for example, the output label vector may be [0.3,0.7], indicating that the neural network considers the sample is an inrush current with a probability of 0.3 and a non-inrush current with a probability of 0.7. This detection result is completely wrong. For another example, the output label vector may be [0.6, 0.4], which indicates that the neural network considers that the sample is an inrush current with a probability of 0.6, and a non-inrush current with a probability of 0.4. Although the detection result shows that the sample is more likely to be an inrush current than a non-inrush current, the difference between the label vector output by neural network and the real label vector is still relatively large, and the training goal of minimizing the difference between the label vector output by neural network and the real label vector has not yet been achieved. The difference between the label vector output by the inrush neural network and the real label vector can be measured by a processing loss L. The determination of the processing loss L is related to a loss function selected for the inrush current detection neural network, which may be one of the mean square error function, cross-entropy loss function, L1 loss function, L2 loss function, and the like. Corresponding to all samples, some samples or one sample of the training sample set input in step 402, the processing loss L may be determined according to Batch Gradient Descent (BGD), Mini-Batch Gradient Descent (SGD) or Stochastic Gradient Descent (MBGD), respectively.

At step S405, it is judged whether the processing loss L is greater than or equal to a preset processing loss threshold $T_L$. The preset processing loss threshold $T_L$ may be selected based on the accuracy of the inrush current detection neural network required by the power environment where the transformer is located, for example, it may be selected as 0.01, 0.02, etc. If it is judged that the processing loss L is greater than or equal to the preset processing loss threshold $T_L$, it is considered that the training of the inrush current detection neural network has not been completed, and the process proceeds to step S406. On the contrary, if it is judged that the processing loss L is less than the preset processing loss threshold $T_L$, it is considered that the training of the inrush current detection neural network has been completed, and the process proceeds to step S407.

At step S406, a parameter of the inrush current detection neural network is updated. This step may be carried out by using the backpropagation algorithm, and one or more parameters in the inrush current detection neural network are updated so that the processing loss L obtained in the next training is smaller. These parameters mainly include weight parameters of each layer of the neural network, for example, a weight matrix of one or more convolution kernels in a convolution layer, a weight matrix of a fully connected layer, and so on. Upon completion of the update, step S402 to step S405 are repeated until it is judged in step S405 that the processing loss L is less than the preset processing loss threshold $T_L$, and then the process proceeds to step S407.

At step S407, the training of the inrush current detection neural network is stopped.

Figure 5:
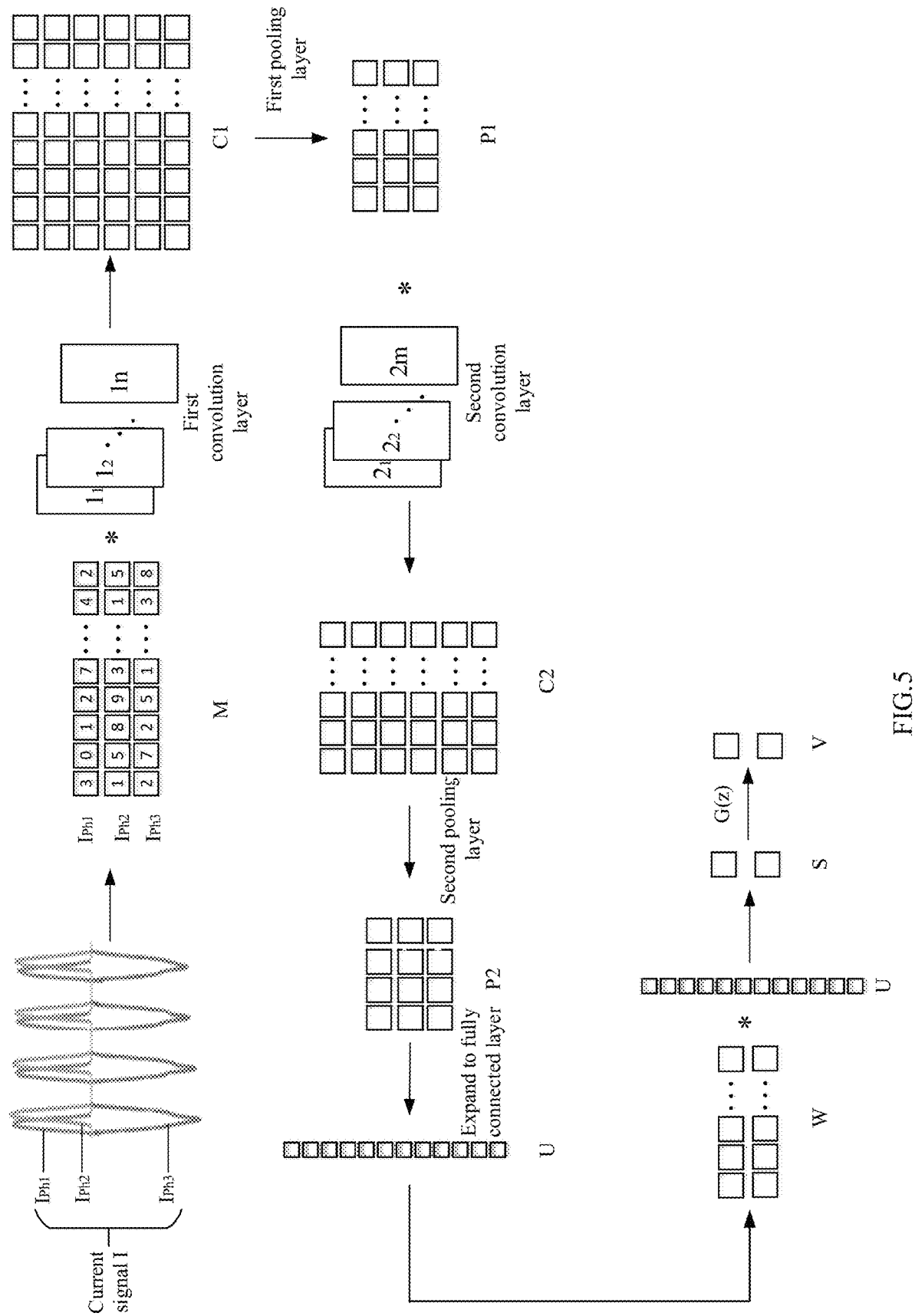
FIG. 5 is a structural schematic diagram of an inrush current detection neural network according to an embodiment of the present disclosure.

FIG. 5 is a structural schematic diagram of an inrush current detection neural network according to an embodiment of the present disclosure.

As shown in FIG. 5, the inrush current detection neural network may be a convolution neural network including a first convolution layer, a second convolution layer, a fully connected layer, an activation layer and an output layer. The first convolution layer may include n convolution kernels: convolution kernel $1_1$, convolution kernel $1_2$, . . . , convolution kernel $1_n$. The second convolution layer may include m convolution kernels: convolution kernel $2_1$, convolution kernel $2_2$, . . . , convolution kernel $2_m$. A numerical matrix input to the inrush current detection neural network is M.

After the numerical matrix M is input into the inrush current detection neural network, it is first processed by the first convolution layer. Each of the first convolution kernels $1_1$ to $1_n$ included in the first convolution layer is convoluted with the numerical matrix M to obtain a convolution result of the first convolution layer, that is, a numerical matrix C1. Each row in the numerical matrix C1 corresponds to a convolution result of each convolution kernel and the numerical matrix M.

When the size of the numerical matrix C1 is large, in order to reduce the amount of data to be processed, the numerical matrix C1 may be pooled by a first pooling layer. The pooling method of the first pooling layer may be an average pooling method or a maximum pooling method. A pooling result of the first pooling layer is recorded as a numerical matrix P1.

Next, the numerical matrix P1 is output to the second convolution layer. Each of the second convolution kernels $2_1$ to $2_m$ included in the second convolution layer is convoluted with the numerical matrix P1 to obtain a convolution result of the second convolution layer, that is, a numerical matrix C2. Each row in the numerical matrix C2 corresponds to a convolution result of every two convolution kernels with the numerical matrix P1.

Similarly, when the size of the numerical matrix C2 is large, in order to further reduce the amount of data to be processed, the numerical matrix C2 can be pooled by a second pooling layer. The pooling method of the second pooling layer may also be an average pooling method or a maximum pooling method. A pooling result of the second pooling layer is recorded as a numerical matrix P2.

Next, the numerical matrix P2 is expanded into one row or one column, and the expanded result is the fully connected layer, which is denoted as a numerical matrix U.

Next, the numerical matrix U is multiplied by the weight matrix W of the fully connected layer to obtain a weighted sum vector S.

At last, the weighted sum vector S is transformed into the label vector V of the output layer through the activation layer. A category corresponding to a maximum value in the label vector V is the prediction result of the inrush current neural network. The activation function G(x) of the activation layer may include but is not limited to one of sigmoid function, relu function and tanh function.

It should be noted that the specific structure of the inrush current detection neural network shown in FIG. 5 is only an example for convenience of explanation. Under specific circumstances, the structure may be changed and modified without departing from the protection scope of this disclosure. For example, when the computing resources are strong enough or the number of values to be processed is small, it is not necessary to include the first and/or second pooling layer; a number of convolution layer, pooling layer and activation layer may be modified according to the training of the inrush current detection neural network; the number and size of convolution kernel included in each convolution layer may also be modified; and the size of convolution kernel included in each convolution layer may also be different, and so on.

For convenience of understanding, a detailed example will be given to explain the training process of the inrush neural network shown in FIG. 5 according to the training method shown in FIG. 4, and the process of detecting whether the current signal I is the inrush current by using the trained inrush neural network.

For convenience of explanation, the following settings are made for this example: the sampling resolution is k=32, the sampling range is N=½ cycles each time, the number of convolution kernels included in the first convolution layer and the second convolution layer of the inrush current detection neural network is both 6, that is, n=m=6, both the sizes of the first convolution kernels $1_1$ to $1_6$ and the second convolution kernels $2_1$ to $2_6$ are all 3×3, the first and second pooling layers are downsampled by the maximum pooling method, the cross-entropy loss function $L=-(y \log \hat{y}+(1-y) \log(1-\hat{y}))$ is adopted as the processing loss function, the processing loss threshold $T_L$ is 0.01, and the activation function $\sigma(z)=1/(1+e^{-z})$ is adopted for the activation layer.

With this example, the training process of the inrush neural network shown in FIG. 5 according to the training method shown in FIG. 4 will be explained.

Corresponding to step S401, EMTP is used to generate 5000 numerical matrices representing sampled current signals as a training sample set, which includes 2500 numerical matrices corresponding to inrush signals and 2500 numerical matrices corresponding to non-inrush signals, these non-inrush signals may include CT saturation current signals, fault current signals or current signals in which the inrush current and the CT saturation coexist. These 5000 numerical matrices are randomly sorted and assigned numbers $M_1 \sim M_{5000}$ in sequence. For the inrush signal sample, its real label vector is [1,0], indicating that the probability of the sample being an inrush signal is 1, and the probability of the sample being a non-inrush signal is 0. For the non-inrush signal sample, the real label vector should be [0,1], indicating that the probability of the sample being an inrush signal is 0, and the probability of the sample being a non-inrush signal is 1.

Corresponding to step S402, the training sample $M_1$ is provided to the inrush current detection neural network. Knowing that $M_1$ is an inrush signal sample, its real label vector is [1,0].

Corresponding to step S403, a label vector $y_1$ corresponding to $M_1$ is output by the inrush current detection neural network, for example, $y_1$=[0.4, 0.6], that is, at this time, the inrush current detection neural network considers that the probability that the sample $M_1$ belongs to the inrush current signal is 0.4, and the probability that the sample $M_1$ belongs to the non-inrush current is 0.6. It shows that the classification of sample $M_1$ by inrush current detection neural network is completely wrong.

Corresponding to step S404, based on the loss function $L_1 = -(y \log \hat{y} + (1-y) \log(1-\hat{y}))$, the inrush current detection neural network determines its processing loss as $L_1 = -(1 \times \log 0.4 + 0 \times \log 0.6) = 0.91$.

Corresponding to step S405, the inrush current detection neural network determines its processing loss as $L_1 = 0.91 \geq T_L = 0.01$.

Corresponding to step S406, the inrush current detection neural network updates its parameters according to the backpropagation algorithm, and these parameters include a weight matrix with the size of 3×3 for the first convolution kernels $1_1$ to $1_6$, a weight matrix with the size of 3×3 for the second convolution kernels $2_1$ to $2_6$, and a weight matrix W with the size of 2×12 for the fully connected layer.

After the update is completed, steps S402~S406 are repeated, that is, a training sample $M_2$ is provided to the inrush current detection neural network, and then a feature extraction, classification, processing loss calculation, and the like are performed for the training sample $M_2$. Until it is judged in step S405 that the processing loss $L < T_L$, the training ends.

After the training is completed, the determined 6×3×3 weight matrix corresponding to six first convolution kernels in the first convolution layer, the determined 6×3×3 weight matrix corresponding to six second convolution kernels in the second convolution layer, and the determined 2×12 weight matrix corresponding to the weight matrix W in the fully connected layer will be obtained. These parameters, together with the structure, loss function and activation function of the previously set inrush current detection neural network, form a trained inrush current detection neural network.

It should be noted that the above simple examples are only for convenience of explanation, and do not limit the disclosure, and various modifications and changes may be made according to actual needs. For example, a plurality of samples may be output at a time in step S402, then the processing loss L calculated in step S404 is an average value of the processing losses of these samples; For example, in a more complicated way, the inrush current detection neural network may also be a neural network trained to perform multi-classification, such as trained to be able to distinguish four current signals, i.e., inrush current, CT saturation current, fault current, and current coexisting with inrush current and CT saturation. In this case, the training samples are divided into four categories, and the corresponding real label vectors are [1,0,0,0], [0,1,0,0], [0,0,1,0] and [0,0,0,1]. The structure and loss function of the inrush current detection neural network may also be adjusted accordingly. Other modifications and changes will not be described in detail in this disclosure.

Next, the process of using the trained inrush current detection neural network to detect whether the current signal I is the inrush current will be explained with this example.

With reference to FIGS. 1 and 5, when the inrush current detection device detects a three-phase current signal I (a waveform of each phase is shown as $Iph_1$, $Iph_2$, $Iph_3$) of the transformer converted by the current transformer, the current signal is sampled for N=½ cycles with sampling resolution of k=32, and a numerical matrix M with a size of 3×16 is obtained, in which a row in M represents a sampling value of a phase.

After M is input into the inrush current detection neural network, six first convolution kernels $1_1$ to $1_6$ included in the first convolution layer are convolved with M respectively, and a convolution result of each convolution kernel with M is a numerical vector including 16 numerical values, so the convolution result of the six first convolution kernels with M is a numerical matrix C1 with a size of 6×16.

To reduce the number of numerical values to be processed, the numerical matrix C1 is pooled by the first pooling layer. In this example, the maximum pooling method is used to downsample the numerical matrix C1 to obtain a numerical matrix P1 with a size of 3×8.

Next, each of the six second convolution kernels $2_1$ to $2_6$ included in the second convolution layer is convoluted with the numerical matrix P1. Similar to the first convolution layer, the convolution result of the second convolution layer is a numerical matrix C2 with a size of 6×8.

To further reduce the number of numerical values to be processed, the numerical matrix C2 is pooled by the second pooling layer. In this example, the maximum pooling method is used to downsample the numerical matrix C2 to obtain a numerical matrix P2 with a size of 3×4.

Next, the numerical matrix P2 is expanded into one row or one column, that is, the numerical values in the matrix P2 are arranged into one row or one column. In this example, the matrix P2 is expanded into one column to obtain a numerical matrix U with a size of 12×1.

Then, a weighted sum vector S with a size of 2×1 is obtained by multiplying a weight matrix W of the fully connected layer with a size of 2×12 by the numerical matrix U with a size of 12×1.

Finally, the weighted sum vector S is transformed into a label vector V through the activation layer, so that a numerical value in the label vector V is in a range of 0~1. The category corresponding to the maximum value in label vector V is the prediction result of the inrush current neural network. For example, if the output label vector V is [0.9956, 0.0044], it indicates that the probability that the detected current signal I is the inrush current is 0.9956, the probability that the detected current signal I is the non-inrush current is 0.0044, and the category corresponding to the maximum value of 0.9956 in the vector V is the inrush current, indicating that the prediction result of the inrush current neural network is the inrush current.

In addition, after the training process shown in FIG. 4 is finished, the trained inrush current detection neural network may be tested, for example, current signal samples not participating in the training process are used as test samples to test the detection effect of the inrush current detection neural network, and the real label vector of each test sample is known.

Figure 6:
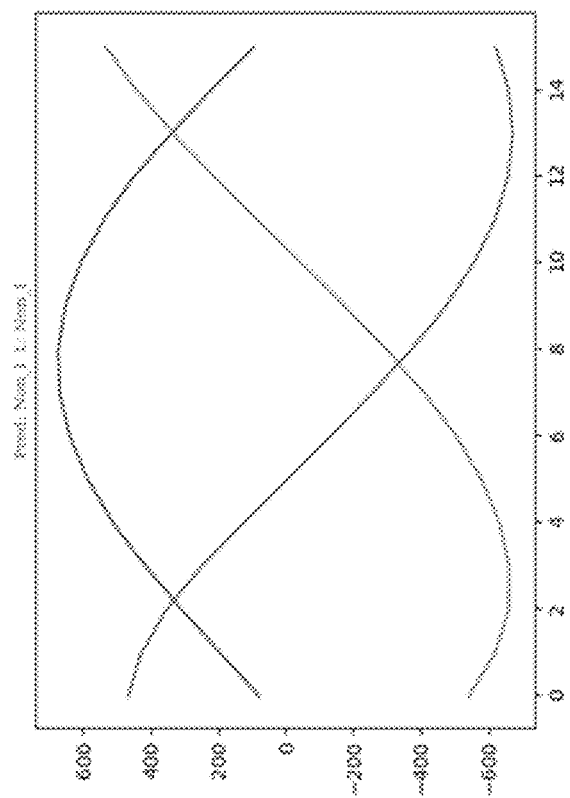
FIG. 6 is a test result obtained by testing a trained inrush current detection neural network according to an embodiment of the present disclosure.
Figure 6:
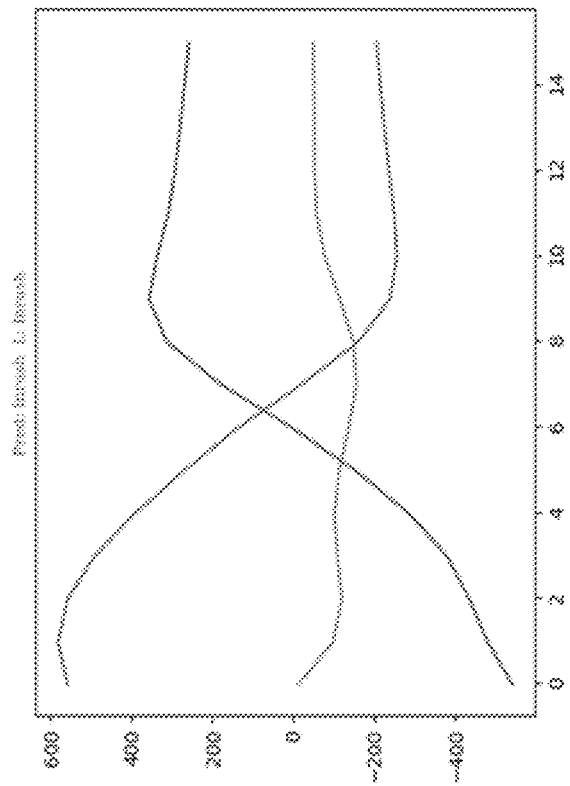

FIG. 6 shows a test result obtained by testing an inrush current detection neural network according to an embodiment of the present disclosure. One inrush current signal sample in the test sample set is shown in the left side of FIG. 6, the abscissa of it represents indexes of sampling points, and the ordinate of it represents current values with the unit of ampere (A). Like the example described in connection with FIGS. 4 and 5, an inrush signal sample is sampled for a half cycle with the sampling resolution of k=32, and a numerical matrix with the size of 3×16 is obtained. The numerical matrix is input into the inrush current detection neural network. After calculation, the inrush current detection neural network outputs a label vector of [0.9964, 0.0036], and the prediction result is "Pred: inrush" (i.e., inrush). One non-inrush signal in the test sample set is shown in the right side of FIG. 6, the abscissa of it represents indexes of sampling points, and the ordinate of it represents current values with the unit of ampere (A). Similarly, the inrush signal is sampled for a half cycle with the sampling resolution of k=32, and a numerical matrix with the size of 3×16 is obtained. The numerical matrix is input into the inrush current detection neural network. After calculation, the inrush current detection neural network outputs a label vector of [0.0052,0.9948], and the prediction result is "Pred: Non_I" (i.e., non-inrush).

The test of the above exemplary convolutional neural network shows that the inrush current detection method according to the embodiment of the present disclosure may realize accurate detection through a sampling range as low as N=½ cycle and a resolution as low as 32 sampling points per cycle. Obviously, it is clear to those skilled in the art that the inrush current detection method of the present disclosure is not limited to the above-mentioned exemplary convolutional neural network, and other suitable neural networks may be used as well.

Figure 7:
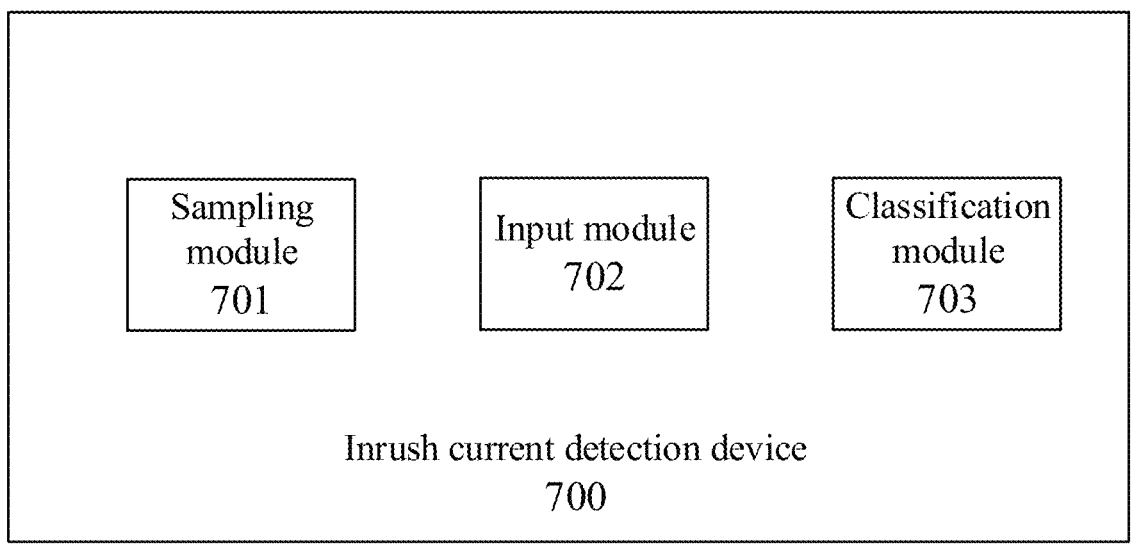
FIG. 7 is a hardware block diagram showing an inrush current detection device according to an embodiment of the present disclosure.

FIG. 7 is a block diagram showing an inrush current detection device 700 according to an embodiment of the present disclosure.

As shown in FIG. 7, the inrush current detection device 700 includes a sampling module 701, an input module 702 and a classification module 703. These three modules may be configured at the same physical location, for example, they are all integrated into the relay shown in FIG. 1. Alternatively, without considering the time delay caused by data communication, one or two of the three modules may be configured to be not at the same physical location as the other two or one, and connected via a wired or wireless communication network, so as to transmit data or commands between each other.

The sampling module 701 is configured to sample at least a part of a current signal I of a transformer to obtain a numerical matrix M. Its sampling resolution is k sampling points per power frequency cycle, and the sampling range of each time may be N cycles of current signal I, N≥½.

The input module 702 provides the numerical matrix M obtained by the sampling module 701 as an input to an inrush current detection neural network. In addition, in order to save computing resources, the input module 702 may also detect whether a maximum value in the numerical matrix M is greater than or equal to a preset enabling threshold, and only when the maximum value in the numerical matrix is greater than or equal to the preset enabling threshold, the numerical matrix is provided as the input to the inrush current detection neural network.

A classification module 703, in which the inrush current detection neural network according to embodiments of the present disclosure is configured, and the inrush current detection neural network outputs a label vector corresponding to the numerical matrix M, and the label vector indicates whether the current signal is inrush an inrush current.

Obviously, the above description about the inrush current detection method is also applicable to the inrush current detection device 700, and will not be repeated here.

Figure 8:
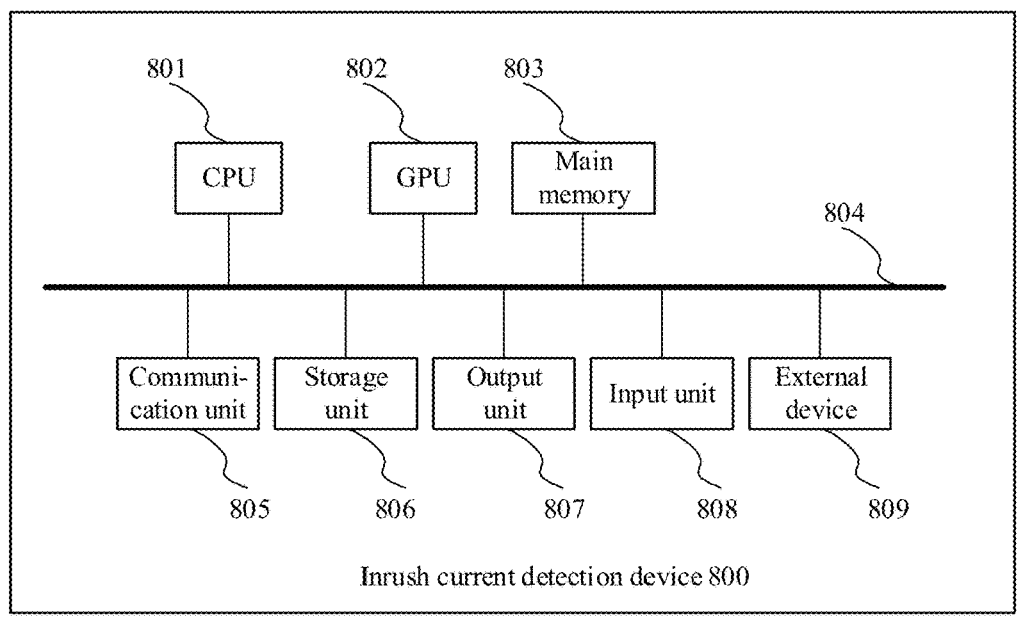
FIG. 8 is a hardware block diagram showing an inrush current detection device according to another embodiment of the present disclosure.

FIG. 8 is a hardware block diagram showing an inrush current detection device 800 according to another embodiment of the present disclosure.

An electronic device 800 according to the embodiment of the present disclosure includes at least a memory for storing computer program instructions and a processor for executing the computer program instructions. When the computer program instructions are loaded and run by the processor, the processor executes the training method of the inrush current detection neural network and the inrush current detection method.

The inrush current detection device 800 shown in FIG. 8 may specifically include a central processing unit (CPU) 801, a graphics processing unit (GPU) 802 and a main memory 803. These units are interconnected by bus 804. The central processing unit (CPU) 801 and/or the graphics processing unit (GPU) 802 may be used as the processor, and the main memory 803 may be used as the memory for storing computer program instructions. In addition, the electronic device 800 may further include a communication unit 805, a storage unit 806, an output unit 807, an input unit 808 and an external device 809, which are also connected to the bus 804.

Figure 9:
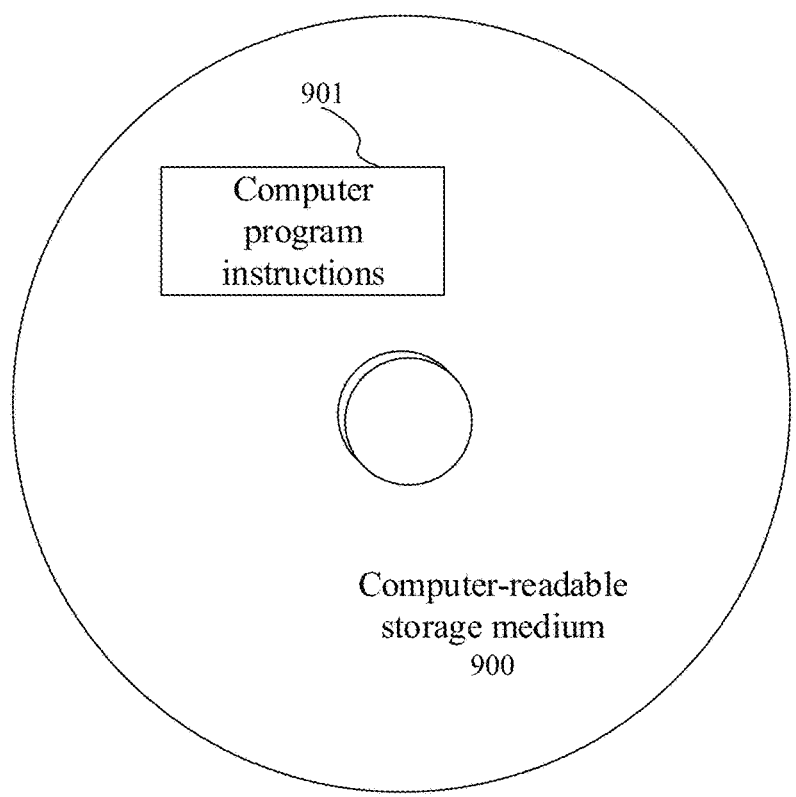
FIG. 9 is a schematic diagram illustrating a computer-readable storage medium according to an embodiment of the present disclosure.

FIG. 9 is a schematic diagram illustrating a computer-readable storage medium according to an embodiment of the present disclosure. As shown in FIG. 9, a computer-readable storage medium 900 according to an embodiment of the present disclosure has computer program instructions 901 stored thereon. When the computer program instructions 901 are executed by a processor, the training method and inrush current detection method of the inrush current detection neural network according to the embodiments of the present disclosure described with reference to the above drawings are executed.

The computer-readable storage medium includes, but is not limited to, a volatile memory and/or a nonvolatile memory, for example. The volatile memory may include random access memory (RAM) and/or cache, for example. The nonvolatile memory may include, for example, a read-only memory (ROM), a hard disk, a flash memory, an optical disk, a magnetic disk, and the like.

In the above, the inrush current detection method and equipment based on the neural network according to the embodiments of the present disclosure have been described with reference to the drawings. Based on the powerful feature extraction and classification function of the neural network, the inrush current detection method, inrush current detection equipment and computer-readable storage medium of the neural network may quickly and accurately judge whether a current signal of the transformer is an inrush current. And the inrush current detection result may be provided to the relay for making a decision whether to adopt "latch-up protection".

Those of ordinary skill in the art may realize that the units and algorithm steps of each example described in connection with the embodiments disclosed herein may be implemented in electronic hardware, or a combination of computer software and electronic hardware. Whether these functions are implemented in hardware or software depends on the specific application and design constraints of the technical scheme. Professionals may use different methods to implement the described functions for each specific application, but such implementation should not be considered beyond the scope of the present invention.

The basic principles of this disclosure have been described above with specific embodiments. However, it should be pointed out that the advantages, benefits and effects mentioned in this disclosure are only examples and not limitations, and these advantages, benefits and effects cannot be considered as necessary for various embodiments of this disclosure. In addition, the specific details disclosed above are only for the purpose of illustration and easy understanding, but not for limitation. The above details do not limit the disclosure to the fact that it must be realized with specific details.

The block diagrams of means, apparatuses, devices and systems involved in this disclosure are only taken as illustrative examples and are not intended to require or imply that they must be connected, arranged and configured in the manner shown in the block diagram. As will be recognized by those skilled in the art, these means, apparatuses, devices and systems may be connected, arranged and configured in any manner. Words such as "including", "comprising", "having" and so on are open words, which mean "including but not limited to" and may be used interchangeably with them. As used herein, the words "or" and "and" refer to the words "and/or" and are used interchangeably with it, unless the context clearly indicates otherwise. As used herein, the word "such as" refers to the phrase "uch as but not limited to" and may be used interchangeably with it.

In addition, as used herein, "or" used in an enumeration of items starting with "at least one" indicates a separate enumeration, so that an enumeration such as "at least one of A, B or C" means A or B or C, or AB or AC or BC, or ABC (i.e., A and B and C). Furthermore, the word "exemplary" does not mean that the described example is preferred or better than other examples.

It should also be pointed out that in the system and method of the present disclosure, each component or step may be decomposed and/or recombined. These decompositions and/or recombination should be regarded as equivalents of the present disclosure.

Various changes, substitutions and modifications to the techniques described herein may be made without departing from the taught techniques defined by the appended claims. In addition, the scope of the claims of this disclosure is not limited to the specific aspects of the composition, means, methods or actions of processes, machines, manufactures, events described above. Composition, means, methods or actions of processes, machines, manufactures, events, which currently exist or are to be developed later, that perform substantially the same functions or achieve substantially the same results as the corresponding aspects described herein may be utilized. Therefore, the appended claims include composition, means, methods or actions of such processes, machines, manufactures, events within their scope.

The above description of the disclosed aspects is provided to enable any person skilled in the art to make or use the disclosure. Various modifications to these aspects will be readily apparent to those skilled in the art, and the general principles defined herein may be applied to other aspects without departing from the scope of this disclosure. Therefore, the disclosure is not intended to be limited to the aspects shown herein, but is to be accorded the widest scope consistent with the principles and novel features disclosed herein.

The above description has been given for purposes of illustration and description. Furthermore, this description is not intended to limit the embodiments of the disclosure to the forms disclosed herein. Although several example aspects and embodiments have been discussed above, those skilled in the art will recognize certain variations, modifications, changes, additions and sub-combinations thereof.

What is claimed is:

1. An inrush current detection method for a transformer, comprising:
   sampling at least a part of a current signal of the transformer to obtain a numerical matrix;
   detecting whether a maximum value in the numerical matrix is greater than a preset enabling threshold;
   providing the numerical matrix as an input to an inrush current detection neural network to predict whether the current signal is an inrush current in a case that the maximum value in the numerical matrix is greater than or equal to the preset enabling threshold, and detecting whether a maximum value in a next numerical matrix is greater than the preset enabling threshold in a case that the maximum value in the numerical matrix is smaller than the preset enabling threshold;
   calculating by the inrush current detection neural network, a label vector corresponding to the input in response to the input provided to the inrush current detection neural network, wherein the label vector indicates whether the current signal is an inrush current; and
   outputting, by the inrush current detection neural network, the calculated label vector.

2. The method according to claim 1, wherein
the at least a part of the current signal is a part corresponding to a half cycle of the current signal.

3. The method according to claim 1, wherein
the current signal is a three-phases current signal, and one row or one column of the numerical matrix corresponds to one phase in the three-phase current signal.

4. The method according to claim 1, wherein
the inrush current detection neural network is a convolution neural network.

5. The method according to claim 1, wherein
the inrush current detection neural network is a trained neural network, and the training includes the following steps:
   step 1, acquiring a current signal training sample set for training the inrush current detection neural network;
   step 2, providing a training sample in the current signal training sample set as an input to the inrush current detection neural network;
   step 3, calculating a label vector corresponding to the training sample by the inrush current detection neural network;
   step 4, determining a processing loss of the inrush current detection neural network based on the label vector of the training sample; and
   step 5: if the processing loss is greater than or equal to a preset processing loss threshold, update a parameter of the inrush current detection neural network and perform steps 2 to 5 based on the updated inrush current detection neural network, and if the processing loss is less than or equal to the preset processing loss threshold, stop the training.

6. The method of claim 5, wherein
the inrush current detection neural network includes at least a first convolution layer, a second convolution layer, a fully connected layer, an activation layer and an output layer; and
the parameter of the inrush current detection neural network includes at least a weight matrix of a first convolution kernel included in the first convolution layer, a weight matrix of a second convolution kernel included in the second convolution layer, and a weight matrix of the fully connected layer.

7. The method of claim 6, wherein
the inrush current detection neural network further includes a first pooling layer between the first convolution layer and the second convolution layer, and a second pooling layer between the second convolution layer and the fully connected layer, and
the first pooling layer and/or the second pooling layer are downsampled by a maximum pooling method.

8. The method of claim 6, wherein
the first convolution layer adopts a first convolution kernel with a size of 3×3;
the second convolution layer adopts a second convolution kernel with a size of 3×3; and
the activation function is one of sigmoid function, relu function and tanh function.

9. the method of claim 5, wherein
one or more samples in the current signal training sample set are generated by an Electro-Magnetic Transient Program EMTP.

10. An inrush current detection device for a transformer, comprising:
a sampling module, configured to sample at least a part of a current signal of the transformer to obtain a numerical matrix;
an input module, configured to detect whether a maximum value in the numerical matrix is greater than a preset enabling threshold, provide the numerical matrix as an input to an inrush current neural network to predict whether the current signal is an inrush current in a case that the maximum value in the numerical matrix is greater than or equal to the present enabling threshold, and detect whether a maximum value in a next numerical matrix is greater than the preset enabling threshold in a case that the maximum value in the numerical matrix is smaller than the preset enabling threshold; and
a classification module, configured with the inrush current detection neural network, wherein the inrush current detection neural network calculates a label vector corresponding to the input in response to the input provided to the inrush current detection neural network and output the calculated label vector, and the label vector indicates whether the current signal is an inrush current.

11. An inrush current detection device for a transformer, comprising:
a processor; and
a memory, wherein a computer-executable program is stored in the memory, and when the program is executed by the processor, the device is caused to execute the method according to claim 1.

12. A computer-readable storage medium having storage medium having stored thereon computer instructions which, when executed by a processor, implement the method according to claim 1.

* * * * *